United States Patent
Masuda et al.

(10) Patent No.: US 9,587,325 B2
(45) Date of Patent: Mar. 7, 2017

(54) METHOD FOR CALCULATING A HEIGHT POSITION OF SILICON MELT SURFACE, METHOD FOR PULLING SILICON SINGLE CRYSTAL, AND SILICON SINGLE CRYSTAL PULLING APPARATUS

(71) Applicant: SHIN-ETSU HANDOTAI CO., LTD., Tokyo (JP)

(72) Inventors: Naoki Masuda, Echizen-cho (JP); Takahiro Yanagimachi, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 305 days.

(21) Appl. No.: 14/375,080

(22) PCT Filed: Jan. 22, 2013

(86) PCT No.: PCT/JP2013/000276
§ 371 (c)(1),
(2) Date: Jul. 28, 2014

(87) PCT Pub. No.: WO2013/125157
PCT Pub. Date: Aug. 29, 2013

(65) Prior Publication Data
US 2014/0373774 A1    Dec. 25, 2014

(30) Foreign Application Priority Data
Feb. 21, 2012    (JP) .................................. 2012-034694

(51) Int. Cl.
*C30B 15/26*    (2006.01)
*C30B 15/20*    (2006.01)
(Continued)

(52) U.S. Cl.
CPC .............. *C30B 15/26* (2013.01); *C30B 15/20* (2013.01); *C30B 29/06* (2013.01);
(Continued)

(58) Field of Classification Search
CPC ......... Y10T 117/1008; Y10T 117/1004; Y10T 117/1012; C30B 15/26; C30B 15/20
See application file for complete search history.

(56) References Cited

U.S. PATENT DOCUMENTS

| 4,915,775 A | 4/1990 | Katsuoka et al. |
| 5,240,684 A * | 8/1993 | Baba ..................... G01B 11/10 |
| | | 117/14 |

(Continued)

FOREIGN PATENT DOCUMENTS

| JP | A-64-24089 | 1/1989 |
| JP | A-11-153418 | 6/1999 |

(Continued)

OTHER PUBLICATIONS

International Search Report issued in International Patent Application No. PCT/JP2013/000276 mailed Mar. 19, 2013.

*Primary Examiner* — Matthew Song
(74) *Attorney, Agent, or Firm* — Oliff PLC

(57) ABSTRACT

A method for calculating a height position of a silicon melt surface at the time of pulling a CZ silicon single crystal is disclosed, including: obtaining a first crystal diameter measured from a fusion ring on a boundary of the silicon melt and the silicon single crystal by using a CCD camera installed at an arbitrary angle relative to the silicon single crystal, and a second crystal diameter measured by using two CCD cameras installed parallel to both ends of a crystal diameter of the silicon single crystal; and calculating the height position of the silicon melt surface in the crucible during pulling of the silicon single crystal from a difference between the first crystal diameter and the second crystal
(Continued)

diameter. As a result, a method for enabling further accurately calculating a height position of a silicon melt surface at the time of pulling a silicon single crystal is provided.

4 Claims, 6 Drawing Sheets

(51) Int. Cl.
*C30B 29/06* (2006.01)
*G01B 11/06* (2006.01)
*G01B 11/08* (2006.01)
*G01B 21/08* (2006.01)

(52) U.S. Cl.
CPC .......... *G01B 11/0608* (2013.01); *G01B 11/08* (2013.01); *G01B 21/08* (2013.01); *Y10T 117/1008* (2015.01); *Y10T 117/1012* (2015.01)

(56) References Cited

U.S. PATENT DOCUMENTS

| | | | | |
|---|---|---|---|---|
| 5,961,716 A | * | 10/1999 | White | C30B 15/26 117/14 |
| 6,030,451 A | * | 2/2000 | LaBrie | C30B 15/26 117/14 |
| 2001/0043733 A1 | | 11/2001 | Altekruger et al. | |
| 2011/0146564 A1 | | 6/2011 | Ohtsuna et al. | |

FOREIGN PATENT DOCUMENTS

| | | |
|---|---|---|
| JP | A-2004-35352 | 2/2004 |
| JP | A-2004-149368 | 5/2004 |
| JP | A-2006-347775 | 12/2006 |
| JP | A-2010-100451 | 5/2010 |
| JP | A-2010-100452 | 5/2010 |
| JP | A-2010-100453 | 5/2010 |

* cited by examiner

METHOD FOR CALCULATING A HEIGHT POSITION OF SILICON MELT SURFACE, METHOD FOR PULLING SILICON SINGLE CRYSTAL, AND SILICON SINGLE CRYSTAL PULLING APPARATUS

TECHNICAL FIELD

The present invention relates to a method for calculating a height position of a silicon melt surface at the time of pulling a silicon single crystal from a silicon melt based on the Czochralski method (the CZ method), a method for pulling a silicon single crystal, and a silicon single crystal pulling apparatus.

BACKGROUND ART

To grow a silicon single crystal based on the CZ method, such a silicon single crystal pulling apparatus as shown in FIG. 9 has been conventionally used.

As shown in FIG. 9, this pulling apparatus 101 has a chamber 102, a crucible 103, crucible-adjusting means 105 for rotating/moving up and down the crucible 103, and a heater 106. Further, the crucible 103 contains a silicon melt 108 molten by the heater 106, and a silicon single crystal 113 is grown by immersing a seed crystal 112 held at a lower end of a wire 111 suspended from the upper side of the chamber 102 in the silicon melt 108 and pulling the seed crystal 112. During pulling, an inert gas is flowed in the chamber 102, and a gas flow-guide cylinder 110 for this purpose is also provided.

As described above, in manufacture of a silicon single crystal including the inert gas flow-guide cylinder in the chamber, for example, a distance from an end of the gas flow-guide cylinder to a silicon melt surface and others must be accurately set. To accurately control a defect in a method for manufacturing, e.g., a defect-free crystal, a temperature gradient (G) near a solid-liquid interface in crystal growth must be controlled, and a position of the silicon melt surface must be accurately measured to execute this control.

In conventional examples, an end of a prismatic seed for manufacture of a single crystal is detected by a laser sensor, stopped at a predetermined position, and moved down from this point, and a distance to come into contact with a silicon melt surface is measured, thereby calculating an accurate position of the silicon melt surface (Patent Literature 1).

CITATION LIST

Patent Literature

Patent Literature 1: Japanese Unexamined Patent Application Publication (Kokai) No. Hei 01-24089

DISCLOSURE OF INVENTION

Problem to be Solved by the Invention

However, according to the above-described method, a height position of a silicon melt surface is measured only on a stage before manufacturing a crystal and, during manufacture of a crystal, the control of the height position is performed in such a manner that the silicon melt surface becomes computationally fixed based on the measured height position of the silicon melt surface. Therefore, the silicon melt surface is not actually fixed due to an error of deformation of a quartz crucible or a diameter of a grown single crystal, thereby causing a variation in quality of the crystal.

Therefore, in view of the above-described problem, it is an object of the present invention to provide a method for enabling further accurately calculating a height position of a silicon melt surface at the time of pulling a silicon single crystal. Further, it is another object of the present invention to provide a method that enables pulling a silicon single crystal while further accurately controlling a height position of a silicon melt surface and a silicon single crystal pulling apparatus.

Means for Solving Problem

To achieve the object, according to the present invention, there is provided a method for calculating a height position of a silicon melt surface at the time of pulling a silicon single crystal from a silicon melt contained in a crucible based on the Czochralski method comprising: obtaining a first crystal diameter measured from a fusion ring on a boundary of the silicon melt and the silicon single crystal by using a CCD camera installed at an arbitrary angle relative to the silicon single crystal, and a second crystal diameter measured by using two CCD cameras installed parallel to both ends of a crystal diameter of the silicon single crystal; and calculating the height position of the silicon melt surface in the crucible during pulling of the silicon single crystal from a difference between the first crystal diameter and the second crystal diameter.

According to such a method for calculating a height position of a silicon melt surface of the present invention, as different from a conventional method by which a height position of a silicon melt surface is actually measured before pulling a silicon single crystal, a height position of a silicon melt surface is calculated from data concerning a silicon single crystal that is being pulled (the first diameter and the second diameter), and hence the height position of the silicon melt surface during pulling the silicon single crystal can be further accurately grasped.

The measurement of the diameters using the CCD camera itself is easy, and using a combination with a different measurement method using this CCD camera enables also obtaining the height position of the silicon melt surface.

Furthermore, since the height position of the silicon melt surface during pulling the silicon single crystal can be accurately grasped, the silicon melt surface can be further accurately controlled to a desired height position. And thereby, it is possible to highly accurately execute control over a temperature gradient near a solid-liquid interface, control over a defect region in the silicon single crystal, and others.

At this time, it is possible that the height position of the silicon melt surface is calculated by obtaining a travel distance $\Delta H$ from a predetermined height position based on $\Delta H = \Delta D/(2 \tan \theta)$ ($\theta$ represents the arbitrary installation angle relative to the silicon crystal of the CCD camera used for measuring the first crystal diameter, and $\Delta D$ represents a difference between the first crystal diameter and the second crystal diameter).

As a result, the height position of the silicon melt surface can be more easily calculated.

Moreover, according to the present invention, there is provided a method for pulling a silicon single crystal, wherein a height position of a silicon melt surface is calculated by using the above method for calculating a height position of a silicon melt surface, and a silicon single crystal is pulled while controlling the height position of the silicon melt surface based on a result of the calculation.

According to such a method for pulling a silicon single crystal of the present invention, the height position of the silicon melt surface during pulling the silicon single crystal can be further accurately grasped, and the height position of the silicon melt surface can be controlled to a desired height position based on the accurate data. Therefore, control over a defect region in the silicon single crystal and others can be further accurately executed. Therefore, the silicon single crystal having desired quality can be stably produced.

Additionally, according to the present invention, there is provided a silicon single crystal pulling apparatus configured to pull a silicon single crystal from a silicon melt contained in a crucible based on the Czochralski method comprising: first-crystal-diameter-measuring means having a CCD camera that is installed at an arbitrary angle relative to the silicon single crystal and configured to measure a crystal diameter from a fusion ring on a boundary between the silicon melt and the silicon single crystal; second-crystal-diameter-measuring means having two CCD cameras installed parallel to both ends of a crystal diameter of the silicon single crystal; and crucible-adjusting means for controlling a height position of the crucible, wherein a height position of a silicon melt surface in the crucible during pulling of the silicon single crystal is calculated from a difference between a first crystal diameter measured by the first-crystal-diameter-measuring means and a second crystal diameter measured by the second-crystal-diameter-measuring means, and the silicon single crystal is pulled while controlling the height position of the crucible by the crucible-adjusting means based on the calculated height position.

According to such a silicon single crystal pulling apparatus of the present invention, the height position of the silicon melt surface during pulling of the silicon single crystal can be accurately and easily calculated, and the silicon single crystal is pulled while controlling the height position of the crucible based on the calculated height position of the silicon melt surface. Therefore, the silicon melt surface can be controlled to a desired height position, and more highly accurate control over a temperature gradient near a solid-liquid interface, control over a defect region in the silicon single crystal, and others can be carried out. As a result, the silicon single crystal having desired quality can be stably produced.

At this time, it is possible that the height position of the silicon melt surface is calculated by obtaining a travel distance $\Delta H$ from a predetermined height position based on $\Delta H = \Delta D/(2 \tan \theta)$ ($\theta$ represents the arbitrary installation angle relative to the silicon crystal of the CCD camera of the first-crystal-diameter-measuring means, and $\Delta D$ represents a difference between the first crystal diameter and the second crystal diameter).

As a result, the height position of the silicon melt surface can be more easily and accurately calculated.

Effect of the Invention

The above-described method for calculating a height position of a silicon melt surface according to the present invention, the method for pulling a silicon single crystal using this calculation method, and the silicon single crystal pulling apparatus enable further accurately obtaining the height position of the silicon melt surface during pulling of the silicon single crystal, and hence highly accurate control can be carried out based on the desired height position. As a result, the silicon single crystal having the desired quality can be stably produced.

BEST MODE FOR CARRYING OUT THE INVENTION

A silicon single crystal pulling apparatus according to the present invention will now be described as an embodiment hereinafter in detail with reference to the drawings, but the present invention is not restricted thereto.

Figure 1:
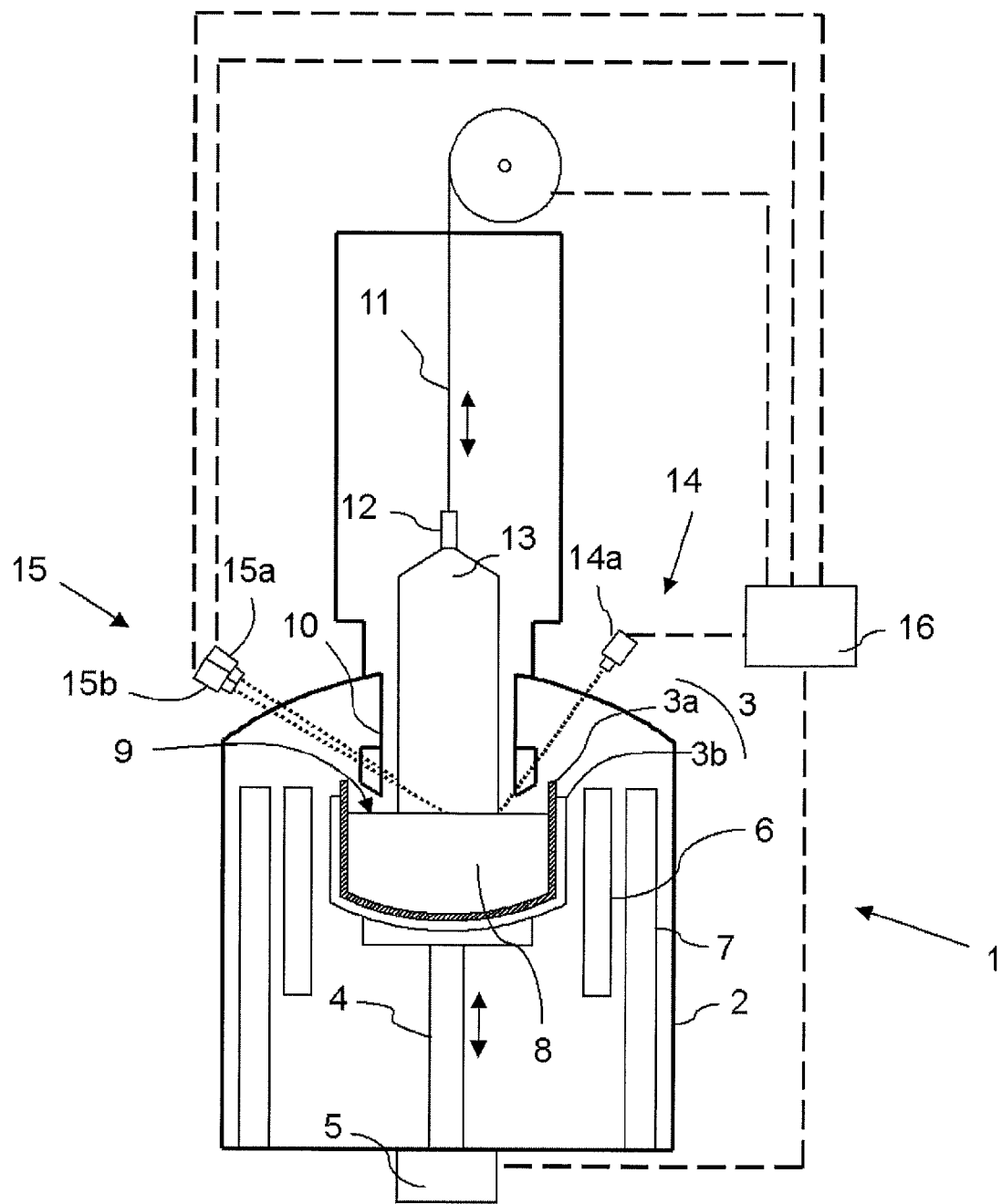
FIG. 1 is a schematic view showing an example of a silicon single crystal pulling apparatus according to the present invention.

FIG. 1 shows an example of a silicon single crystal pulling apparatus based on a CZ method according to the present invention.

This silicon single crystal pulling apparatus (which will be also simply referred to as a pulling apparatus hereinafter) 1 includes a chamber 2 formed into a hollow cylindrical shape, and a crucible 3 is arranged at a central portion thereof. This crucible has a double structure, and it is constituted of a quartz crucible 3a formed into a cylindrical shape with a bottom and a graphite crucible 3b formed into a cylindrical shape with a bottom adapted to hold an outer side of the quartz crucible 3a.

Furthermore, this crucible 3 is fixed to an upper end portion of a support shaft 4 to enable rotation and upward and downward movement, and a rotating speed or a height position of the crucible 3 can be adjusted by crucible-adjusting means 5 using a motor or the like.

A resistance heating type heater 6 is substantially concentrically arranged on the outer side of the crucible. Moreover, an insulating material 7 is concentrically arranged around the outer side of the heater 6. Additionally, a silicon melt 8 that is heated by the heater 6 and obtained by melting a silicon material is contained in the crucible 3.

A gas flow-guide cylinder 10 for an inert gas that is flowed in the chamber 2 during pulling is arranged above a surface of the silicon melt (a silicon melt surface 9). In addition, besides this arrangement, a cooling gas may be blown, or a cylindrical cooling apparatus or the like that blocks radiant heat and cools a silicon single crystal may be provided.

A wire 11 that rotates on the same axis as the support shaft 4 in an opposite direction or the same direction at a predetermined speed is arranged on a central axis of the crucible 3 filled with the silicon melt 8, and a seed crystal 12 is held at a lower end of the wire 11. Further, a silicon single crystal 13 is formed on a lower end surface of the seed crystal 12.

Furthermore, the pulling apparatus 1 includes means for measuring a diameter of the silicon single crystal 13. They are first-crystal-diameter-measuring means 14 and second-crystal-diameter-measuring means 15. The first-crystal-diameter-measuring means 14 includes a CCD camera 14a that enables observing the silicon single crystal 13 from a window provided in the chamber 2. Moreover, the second-crystal-diameter-measuring means 15 includes two CCD cameras 15a and 15b. Additionally, the measuring means 14 and 15 are connected to a control unit 16 constituted of a computer or the like so that data from the CCD cameras 14a, 15a, and 15b can be transmitted, data processing can be executed, and a first crystal diameter, a second crystal diameter, a difference between these diameters, a height position of the silicon melt surface 9, and others can be calculated.

Further, the control unit 16 is connected to the crucible-adjusting means 5 or a mechanism that controls taking-up of the wire 11, and feedback to, e.g., a height position of the crucible 3 or a pulling rate of the silicon single crystal 13 by the wire 11 can be performed based on the obtained height position of the silicon melt surface 9, thereby effecting automatic control. An appropriate program may be previously incorporated so that the silicon melt surface 9 can be automatically controlled to a predetermined height position or the pulling rate can be automatically controlled to a predetermined value.

The first-crystal-diameter-measuring means 14 and the second-crystal-diameter-measuring means 15 will now be described hereinafter.

Figure 2:
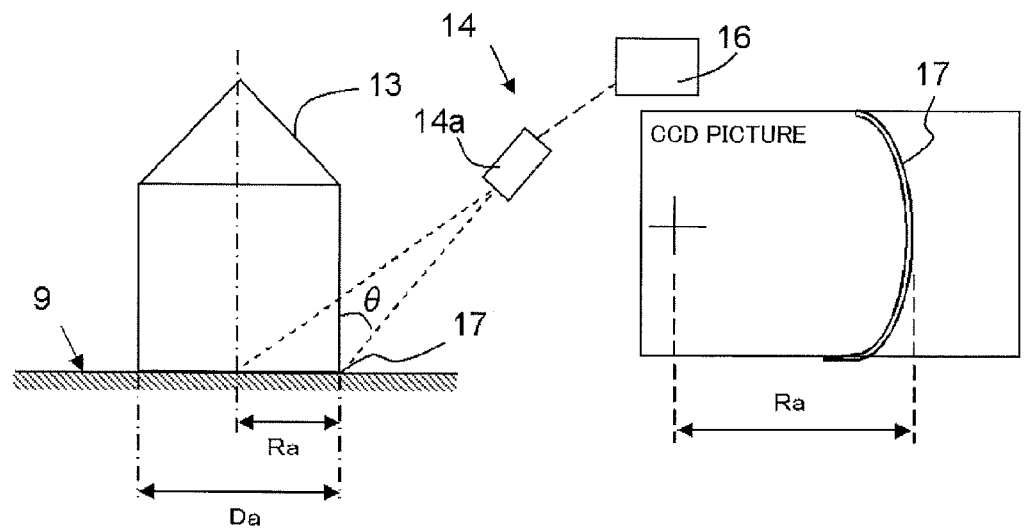
FIG. 2 is an explanatory view showing a relationship between a CCD camera as first-crystal-diameter-measuring means and a diameter of a silicon single crystal.

The first-crystal-diameter-measuring means 14 will be first explained. FIG. 2 shows a relationship between the CCD camera 14a and a diameter of the silicon single crystal 13.

One CCD camera 14a is installed at an arbitrary predetermined angle θ with respect to the silicon single crystal 13. The CCD camera 14a detects a fusion ring 17 (a high luminance zone) that is present on a boundary between the silicon melt 8 and the silicon single crystal 13, and a first crystal diameter can be obtained by the first-crystal-diameter-measuring means 14. In case of FIG. 2, a crystal diameter Da (a crystal radius Ra×2) is measured.

Figure 3:
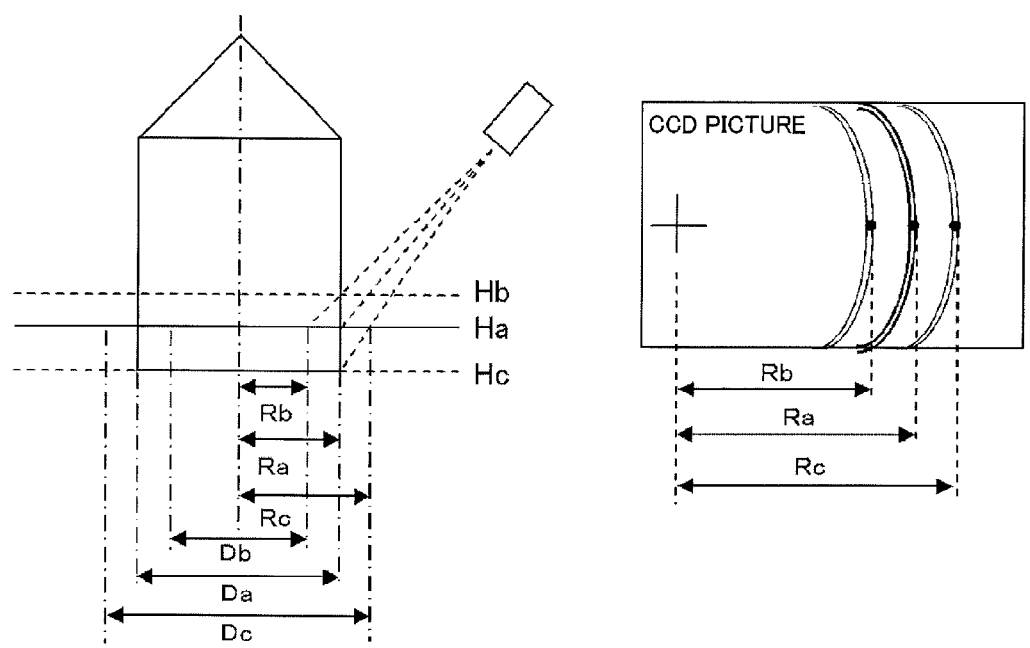
FIG. 3 is an explanatory view showing a relationship between the CCD camera as the first-crystal-diameter-measuring means and a diameter of the silicon single crystal when a height position of a silicon melt surface changes.

It is to be noted that measurement performed by this first-crystal-diameter-measuring means 14 is affected by a height position of the silicon melt surface 9, and an error is produced. FIG. 3 shows a relationship between the CCD camera 14a and the diameter of the silicon single crystal 13 when the height position of the silicon melt 9 changes.

For example, in a case where the silicon melt surface 9 reaches a height position Hb raised from a predetermined height Ha that has been set in advance, the silicon melt surface 9 is assumed to be fixed (Ha) and the measurement is carried out even though an actual crystal diameter is Da (i.e., Ra×2). Therefore, it is measured short as Db (i.e., Rb×2). In a case where the silicon melt surface 9 reaches a height position Hc lowered from the predetermined height position Ha, the silicon melt surface is likewise assumed to be fixed (Ha) and the measurement is carried out, and hence it is measured long as Dc (i.e., Rc×2).

Figure 4:
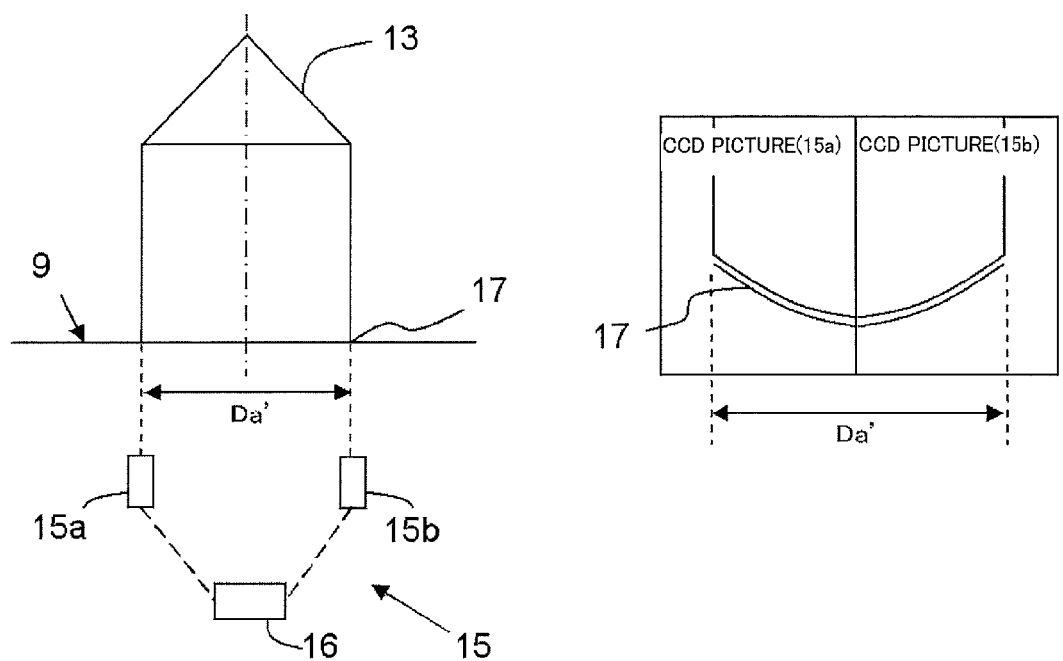
FIG. 4 is an explanatory view showing a relationship between the CCD camera as second-crystal-diameter-measuring means and a diameter of the silicon single crystal.

On the other hand, in the second-crystal-diameter-measuring means 15, the two CCD cameras 15a and 15b are installed. FIG. 4 shows a relationship between the CCD cameras 15a and 15b and a diameter of the silicon single crystal 13. A second crystal diameter is measured by using these CCD camera 15 and 15b (Da' in FIG. 4).

The CCD cameras 15a and 15b are installed to be parallel to both ends of a diameter of the silicon single crystal 13. For example, an installation distance between the CCD cameras 15a and 15b may be set to a target length of the crystal diameter, however, of course, the present invention is not restricted thereto. A mechanism or the like that enables them to perform parallel translation as required can be installed.

Figure 5:
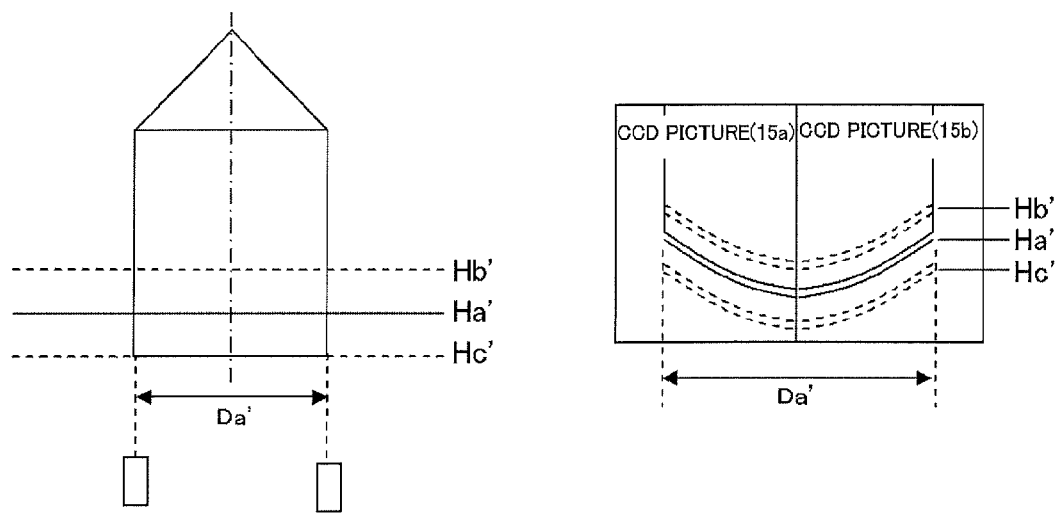
FIG. 5 is an explanatory view showing a relationship between the CCD camera as the second-crystal-diameter-measuring means and a diameter of the silicon single crystal when the height position of the silicon melt surface changes.

Measurement performed by this second-crystal-diameter-measuring means 15 is not affected by a height position of the silicon melt surface 9. FIG. 5 shows a relationship between the CCD cameras 15a and 15b and the diameter of the silicon single crystal 13 when the height position of the silicon melt surface 9 changes.

For example, when the silicon melt surface 9 rises from a predetermined height position Ha' and reaches a height position Hb' or when it lowers and reaches a height position Hc', a crystal diameter to be measured is Da' in both cases. A viewing field only moves up and down, and the crystal diameter measured does not change.

Further, the control unit 16 calculates a difference between the first crystal diameter measured by using the CCD camera 14a of the first-crystal-diameter-measuring means 14 and the second crystal diameter measured by using the CCD cameras 15a and 15b of the second-crystal-diameter-measuring means 15, and also calculates a height position of the silicon melt surface.

Figure 6:
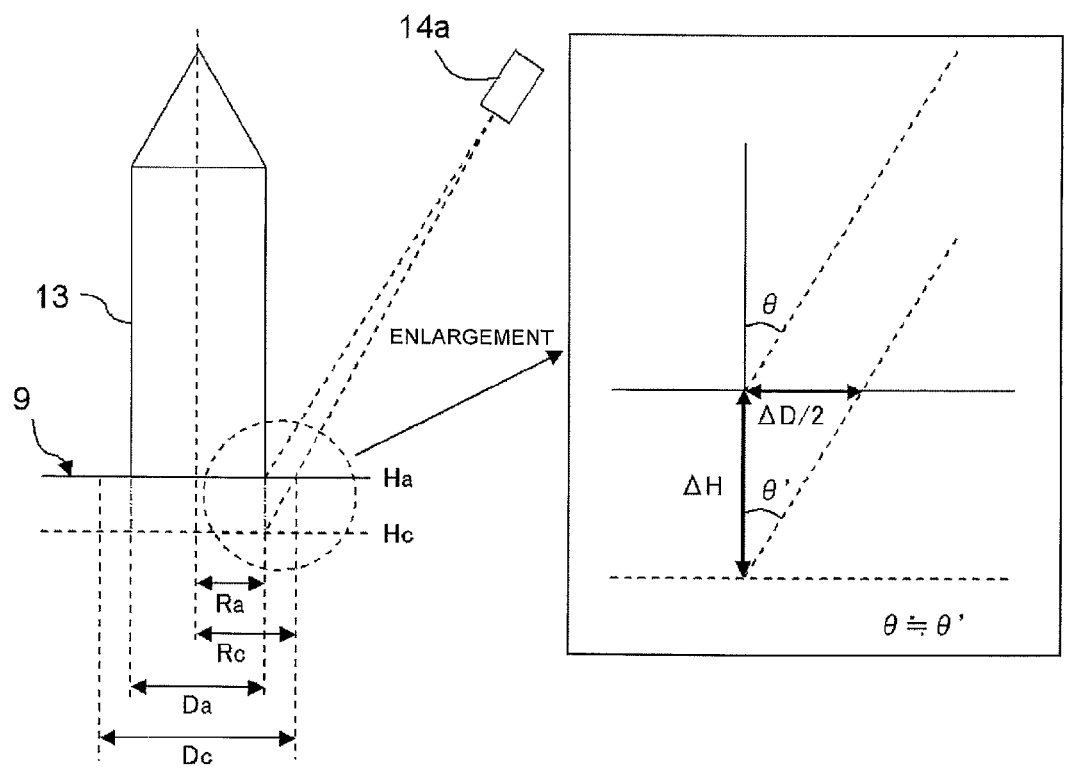
FIG. 6 is an explanatory view showing a relationship between the height position of the silicon melt surface and a difference between a first crystal diameter and a second crystal diameter.

Although a calculation program in the control unit 16 is not restricted in particular, for example, the following program may be adopted. FIG. 6 shows a relationship between a height position of the silicon melt surface (or a travel distance from a predetermined height position) and a difference between the first crystal diameter and the second crystal diameter.

Here, a description will be given as to an example where the silicon melt surface 9 lowers from the predetermined height position Ha to Hc during pulling of the silicon single crystal 13, i.e., the first crystal diameter changes from Da (i.e., Ra×2) to Dc (i.e., Rc×2) and the second crystal diameter remains Da.

Here, ΔH is a travel distance of the silicon melt surface from the predetermined height position Ha to Hc.

Furthermore, ΔD is a difference between the first crystal diameter and the second crystal diameter (Dc−Da).

Moreover, θ is an installation angle of the CCD camera 14a relative to the silicon single crystal 13. That is, it is an angle formed between a direction from the fusion ring to the CCD camera 14a when the height position of the silicon melt surface is Ha and a side surface of the silicon single crystal 13.

Additionally, θ' is an angle formed between a direction from the fusion ring to the CCD camera 14a when the height position of the silicon melt surface is Hc and the side surface of the silicon single crystal 13.

For example, θ' is approximated to θ, and the following expression can be calculated based on a relationship shown in FIG. 6:

$$\Delta H = \Delta D/(2 \tan \theta) \quad \text{(Expression 1)}$$

Further, the actual height position Hc can be calculated from the predetermined height position Ha and the travel distance ΔH. In this manner, using the expression that approximates θ and θ' enables easily obtaining the travel distance of the silicon melt surface 9 and further obtaining the height position. It is needless to say that θ' may be obtained without approximation and the height position Hc may be calculated.

A method for calculating a height position of a silicon melt surface and a method for pulling a silicon single crystal according to the present invention will now be described.

The silicon single crystal 13 is pulled by using such a pulling apparatus 1 as shown in FIG. 1.

First, a high-purity polycrystal starting material of silicon is heated to or above a melting point (approximately 1420° C.) by the heater 6 and molten in the crucible 3. Then, an end of the seed crystal 12 is brought into contact with or immersed in a substantially central portion of the surface of the silicon melt 8 by winding off the wire 11. Subsequently, the support shaft 4 is rotated in an appropriate direction, the wire 11 is taken up while being rotated, and the seed crystal 12 is pulled up, thereby starting growth of the silicon single crystal 13.

Then, the silicon single crystal 13 having desired quality, e.g., a defect-free region is pulled by appropriately adjusting a pulling rate and others. At the time of controlling a defect region or the like in the silicon single crystal 13 as described above, not only the pulling rate but also a temperature gradient G near a solid-liquid interface (Gc in a crystal central portion of the silicon single crystal, and Ge in a crystal peripheral portion of the same) must be appropriately controlled.

Furthermore, to control the temperature gradient near the solid-liquid interface, a distance from the silicon melt surface 9 to an end of the gas flow-guide cylinder 10 and others must be accurately controlled, and it is important to accurately grasp a height position of the silicon melt surface 9 during pulling of the silicon single crystal 13 in order to achieve this control.

Therefore, in the calculation method according to the present invention, the height position of the silicon melt surface 9 is calculated by using the first-crystal-diameter-measuring means 14 and the second-crystal-diameter-measuring means 15.

It is to be noted that, for example, the height position of the silicon melt surface 9 previously measured before pulling can be determined as a reference. It is needless to say that the present invention is not restricted thereto, and a position that is apart from the gas flow-guide cylinder 10 or the like by a predetermined distance may be determined as a reference, and the reference can be determined each time.

In case of calculating the height position of the silicon melt surface 9, a first crystal diameter of the silicon single crystal 13 during pulling is measured by using the CCD camera 14a of the first-crystal-diameter-measuring means 14, and a second crystal diameter of the same is measured by using the CCD cameras 15a and 15b of the second-crystal-diameter-measuring means 15. A difference between these diameters is calculated by the control unit 16, a travel distance of the silicon melt surface 9 is appropriately obtained based on the above-described (Expression 1), and the height position of the silicon melt surface 9 at each time is calculated.

Furthermore, in the pulling method according to the present invention, a height position of the crucible 3 is appropriately controlled by, e.g., the crucible-adjusting means 5 based on the thus calculated height position of the silicon melt surface 9 with the use of a program preset in the control section 16. The temperature gradient G near the solid-liquid interface is controlled by, e.g., keeping the height position of the silicon melt surface 9 to the above-described reference height position and, at the same time, the silicon single crystal 13 is pulled under a control of a predetermined pulling rate by the control unit 16.

As a result, V/G (a ratio of the pulling rate and the temperature gradient) required for forming a desired defect region can be highly accurately controlled. Moreover, a high-quality silicon single crystal or the like having a diameter maintained constant and having a defect-free region can be stably obtained in high yield.

EXAMPLES

Although the present invention will now be more specifically explained hereinafter based on an example and a comparative example, but the present invention is not restricted thereto.

Example

The method for calculating a height position of a silicon melt surface and the method for pulling a silicon single crystal according to the present invention were carried out by the CZ method using the silicon single crystal pulling apparatus 1 according to the present invention shown in FIG. 1, thereby pulling the silicon single crystal.

The quartz crucible 3 that is installed in the chamber 2 of the silicon single crystal pulling apparatus 1 and has a diameter of 812 mm was filled with 360 kg of polycrystal silicon, and the graphite heater 6 was energized to melt the polycrystal silicon.

Then, the seed crystal 12 was brought into contact with a melt surface, rotated in a direction opposite to a rotating direction of the crucible 3 at 8 rpm, and moved up by a taking-up mechanism for the wire 11, thereby growing the silicon single crystal 13.

At this time, a position apart from the end of the gas flow-guide cylinder 10 by a predetermined distance was determined as a reference and a height position of the crucible 3 was controlled so as to maintain the silicon melt surface 9 at the height position of the reference, in order that a predetermined temperature gradient G near a solid-liquid interface can be obtained for the sake of obtaining a distribution of a desired defect region in a crystal axis direction. Specifically, the silicon single crystal was pulled with measuring a first crystal diameter and a second crystal diameter by the first-crystal-diameter-measuring means 14 and the second-crystal-diameter-measuring means 15, calculating a height position of the silicon melt surface 9 from the above-described (Expression 1), subjecting a height position of the crucible 3 to feedback control by the crucible-adjusting means 5 through the control unit 16.

It is to be noted that the CCD camera 14a was installed at an angle of 45 degrees with respect to the silicon single crystal, and measurement was carried out.

Figure 7:
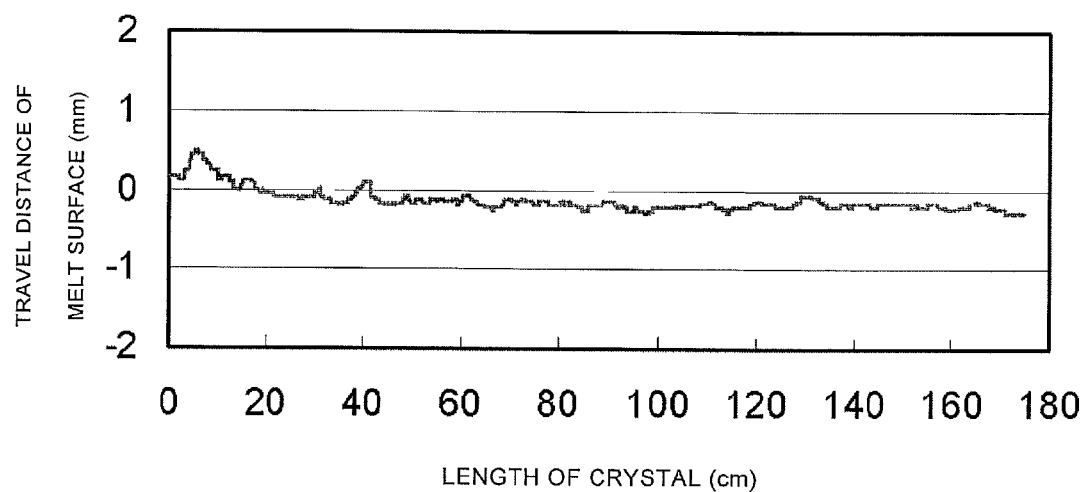
FIG. 7 is a graph showing a relationship between a travel distance of the silicon melt surface and a crystal length in an example.

FIG. 7 shows a relationship between a length of the pulled crystal and a travel distance of the silicon melt surface estimated from a difference between the first crystal diameter and the second crystal diameter.

It can be understood that a travel distance of the height position of the silicon melt surface is substantially 0 mm over the entire length in the crystal axis direction and can be maintained without greatly deviating from the height position of the reference during pulling.

Moreover, examining the pulled silicon single crystal revealed that a desired defect region was obtained over the entire length in the crystal axis direction.

Comparative Example

Based on the CZ method, the same crystal quality as Example was targeted, and a silicon single crystal was pulled.

At this time, a position apart from the end of the gas flow-guide cylinder 10 by a predetermined distance was determined as a reference and a height position of the crucible 3 was controlled so as to maintain the silicon melt surface 9 at the height position of the reference, in order that a predetermined temperature gradient G near a solid-liquid interface can be obtained for the sake of obtaining a distribution of a desired defect region in a crystal axis direction. It is to be noted that data such as a diameter of the silicon single crystal that was being pulled was not used, a change in height position of the silicon melt surface or the like was estimated by only a calculation from data of a height position of the silicon melt surface before pulling and others, and the height position of the crucible was controlled. Other points are the same conditions as those in Example.

Figure 8:
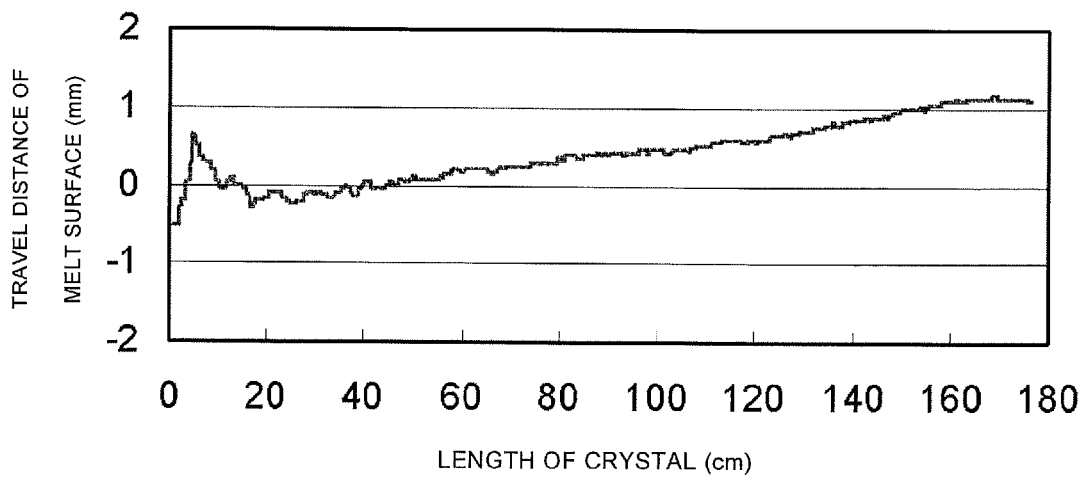
FIG. 8 is a graph showing a relationship between a travel distance of the silicon melt surface and a crystal length in a comparative example.
Figure 9:
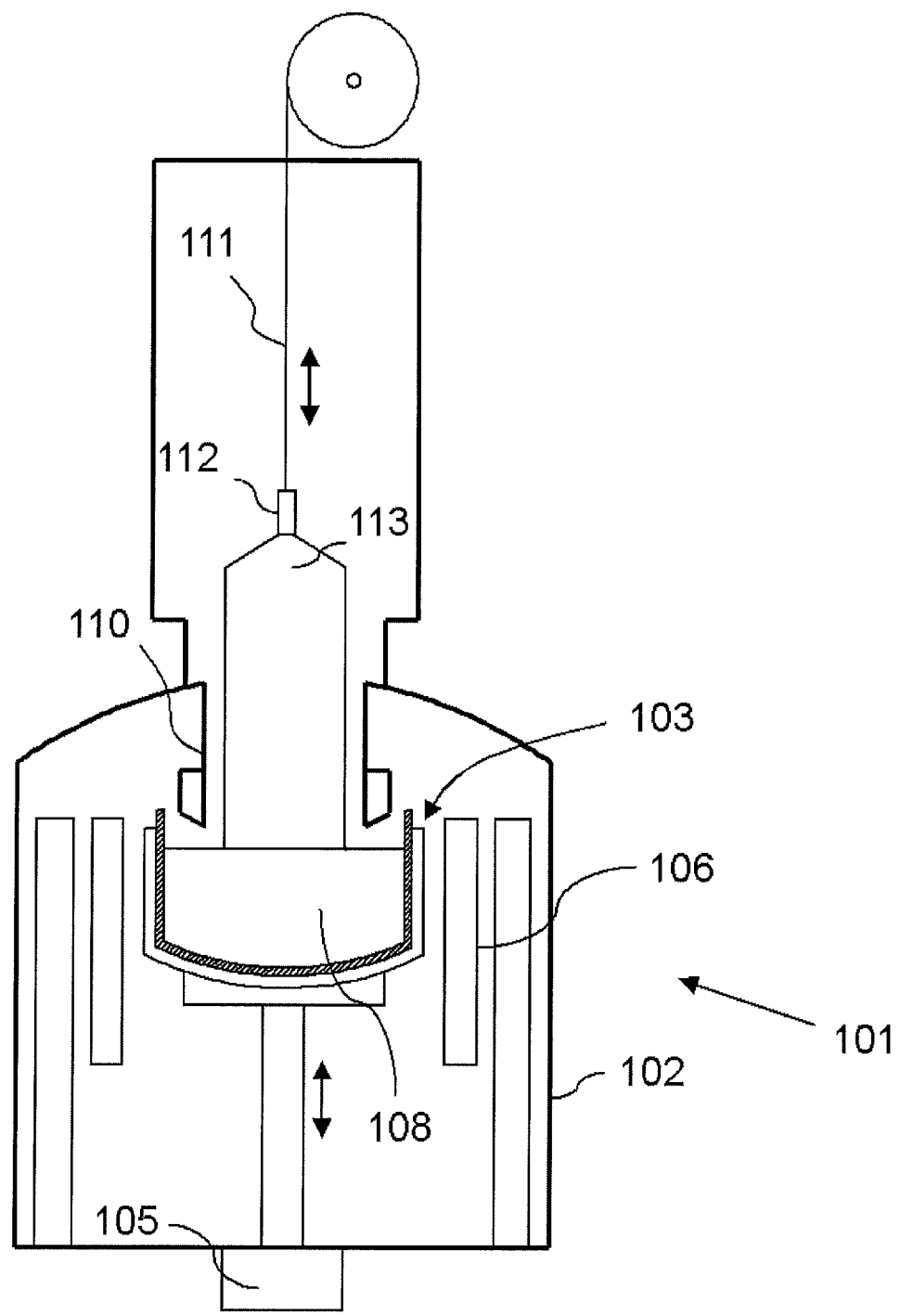
FIG. 9 is a schematic view showing an example of a conventional silicon single crystal pulling apparatus.

FIG. 8 shows a relationship between a length of the pulled crystal and a travel distance of the silicon melt estimated from a difference between the first crystal diameter and the second crystal diameter.

The travel distance of the silicon melt surface gradually increased as the crystal grew, and it eventually 1 mm deviated from the reference.

Therefore, examining the pulled silicon single crystal revealed that a portion where a desired defect region was not obtained was extensively present in a latter half of pulling. It can be considered that deformation of the quartz crucible or the like occurred during pulling of the silicon single crystal and the height position of the silicon melt surface thereby deviated from an estimation provided by the original calculation.

As described above, Comparative Example cannot cope with a change in height position of the silicon melt surface during pulling of the silicon single crystal due to various factors. Therefore, control over the height position of the silicon melt surface, control over V/G and others cannot be appropriately carried out, and the silicon single crystal having target quality cannot be obtained.

On the other hand, in Example carrying out the present invention, feedback control over the height position of the crucible and others can be easily performed by using data concerning the diameter of the silicon single crystal during actual pulling. As a result, the height position of the silicon melt surface was highly accurately calculated/controlled, thus the silicon single crystal having target quality can be obtained.

It is to be noted that the present invention is not restricted to the foregoing embodiment. The foregoing embodiment is an illustrative example, and any example that has substantially the same configuration and exercises the same functions and effects as the technical concept described in claims of the present invention is included in the technical scope of the present invention.

The invention claimed is:

1. A method for calculating a height position of a silicon melt surface at the time of pulling a silicon single crystal from a silicon melt contained in a crucible based on the Czochralski method comprising:
    obtaining a first crystal diameter measured from a fusion ring on a boundary of the silicon melt and the silicon single crystal by using a CCD camera installed at an arbitrary angle relative to the silicon single crystal, and a second crystal diameter measured by using two CCD cameras installed parallel to both ends of a crystal diameter of the silicon single crystal; and
    calculating the height position of the silicon melt surface in the crucible during pulling of the silicon single crystal from a difference between the first crystal diameter and the second crystal diameter.

2. The method for calculating a height position of a silicon melt surface according to claim 1,
    wherein the height position of the silicon melt surface is calculated by obtaining a travel distance $\Delta H$ from a predetermined height position based on $\Delta H = \Delta D/(2 \tan \theta)$ ($\theta$ represents the arbitrary installation angle relative to the silicon crystal of the CCD camera used for measuring the first crystal diameter, and $\Delta D$ represents a difference between the first crystal diameter and the second crystal diameter).

3. A method for pulling a silicon single crystal,
    wherein a height position of a silicon melt surface is calculated by using the method for calculating a height position of a silicon melt surface according to claim 1, and a silicon single crystal is pulled while controlling the height position of the silicon melt surface based on a result of the calculation.

4. A method for pulling a silicon single crystal,
    wherein a height position of a silicon melt surface is calculated by using the method for calculating a height position of a silicon melt surface according to claim 2, and a silicon single crystal is pulled while controlling the height position of the silicon melt surface based on a result of the calculation.

* * * * *